(12) United States Patent  
Everaerts et al.

(10) Patent No.: US 10,763,314 B2
(45) Date of Patent: Sep. 1, 2020

(54) FLEXIBLE ELECTRONIC DEVICE WITH FLUID CAVITY DESIGN

(71) Applicant: 3M INNOVATIVE PROPERTIES COMPANY, St. Paul, MN (US)

(72) Inventors: Albert I. Everaerts, Tucson, AZ (US); Fay T. Salmon, Eden Prairie, MN (US)

(73) Assignee: 3M INNOVATIVE PROPERTIES COMPANY, St. Paul, MN (US)

(*) Notice: Subject to any disclaimer, the term of this patent is extended or adjusted under 35 U.S.C. 154(b) by 0 days.

(21) Appl. No.: 16/063,860

(22) PCT Filed: Dec. 28, 2016

(86) PCT No.: PCT/US2016/067954
§ 371 (c)(1),
(2) Date: Jun. 19, 2018

(87) PCT Pub. No.: WO2017/116892
PCT Pub. Date: Jul. 6, 2017

(65) Prior Publication Data
US 2018/0374906 A1    Dec. 27, 2018

Related U.S. Application Data

(60) Provisional application No. 62/271,422, filed on Dec. 28, 2015.

(51) Int. Cl.
*H01L 27/32* (2006.01)
*G06F 3/041* (2006.01)
*H01L 51/00* (2006.01)

(52) U.S. Cl.
CPC ............ *H01L 27/323* (2013.01); *G06F 3/041* (2013.01); *H01L 51/0097* (2013.01);
(Continued)

(58) Field of Classification Search
CPC ............... H01L 27/323; H01L 51/0097; H01L 2251/5338; G06F 3/041;
(Continued)

(56) References Cited

U.S. PATENT DOCUMENTS 5,907,375 A * 5/1999 Nishikawa .......... G02F 1/13338
  349/12
9,069,521 B2    6/2015 Lee
(Continued)

FOREIGN PATENT DOCUMENTS

EP    2833426    2/2015
EP    2894672    7/2015
(Continued)

OTHER PUBLICATIONS

International Search Report for PCT International Application No. PCT/US2016/067954, dated Mar. 14, 2017, 5 pages.

*Primary Examiner* — Tom V Sheng
(74) *Attorney, Agent, or Firm* — 3M Innovative Properties Company

(57) ABSTRACT

The present invention is a flexible display including a fluid cavity, fluid within the fluid cavity, and a strain/stress-sensitive module positioned within the fluid cavity. The strain/stress-sensitive module includes a flexible substrate, a flexible encapsulation layer, and an OLED layer positioned between the flexible substrate and the flexible encapsulation layer.

19 Claims, 3 Drawing Sheets

(52) U.S. Cl.
CPC ............... *G06F 2203/04102* (2013.01); *H01L 2251/5338* (2013.01); *Y02E 10/549* (2013.01)

(58) Field of Classification Search
CPC . G06F 2203/04102; G06F 2203/04103; G06F 1/1652; Y02E 10/549; G02F 1/133305
See application file for complete search history.

(56) References Cited

U.S. PATENT DOCUMENTS

| | | | |
|---|---|---|---|
| 9,728,593 B2 | 8/2017 | Koo | |
| 2004/0257635 A1* | 12/2004 | Paolini, Jr. | ............... G02F 1/167 359/296 |
| 2006/0132030 A1* | 6/2006 | Gao | .................... H01L 51/5237 313/511 |
| 2007/0054440 A1 | 3/2007 | Hu | |
| 2007/0152956 A1* | 7/2007 | Danner | .................... G02F 1/161 345/107 |
| 2008/0198541 A1* | 8/2008 | Lin | ....................... G06F 1/1615 361/679.05 |
| 2009/0059154 A1* | 3/2009 | Chuang | ................. G02F 1/1339 349/153 |
| 2010/0103123 A1* | 4/2010 | Cohen | ................... G06F 1/1601 345/173 |
| 2012/0188488 A1* | 7/2012 | Hwang | ................. G02F 1/1333 349/92 |
| 2012/0229390 A1 | 9/2012 | Huang | |
| 2013/0241841 A1 | 9/2013 | Orsley | |
| 2014/0065326 A1 | 3/2014 | Lee | |
| 2014/0210761 A1* | 7/2014 | Ciesla | .................... G06F 3/0202 345/173 |
| 2015/0014644 A1 | 1/2015 | Namkung | |
| 2015/0036269 A1 | 2/2015 | Kim | |
| 2015/0102296 A1 | 4/2015 | Kim | |
| 2015/0147532 A1 | 5/2015 | Nam | |
| 2015/0179722 A1 | 6/2015 | Koo | |
| 2015/0200375 A1 | 7/2015 | Kim | |
| 2015/0220117 A1* | 8/2015 | Lee | ........................ G06F 1/1641 361/749 |
| 2016/0164030 A1* | 6/2016 | Yasuda | ............... H01L 51/0097 349/122 |
| 2016/0226015 A1 | 8/2016 | Kauhaniemi | |
| 2017/0027514 A1* | 2/2017 | Biederman | ............. G06F 1/163 |
| 2017/0092892 A1 | 3/2017 | Zhang | |
| 2017/0123245 A1* | 5/2017 | Iwai | .................. G02F 1/133514 |

FOREIGN PATENT DOCUMENTS

| | | |
|---|---|---|
| WO | WO 2004-046767 | 6/2004 |
| WO | WO 2012-054781 | 4/2012 |
| WO | WO 2014-101080 | 3/2014 |
| WO | WO 2016-196458 | 12/2016 |
| WO | WO 2016-196460 | 12/2016 |
| WO | WO 2016-196541 | 12/2016 |
| WO | WO 2016-196576 | 12/2016 |
| WO | WO 2016-196736 | 12/2016 |

\* cited by examiner

FLEXIBLE ELECTRONIC DEVICE WITH FLUID CAVITY DESIGN

BACKGROUND

Mobile hand held device makers are constantly looking for ways to differentiate their devices in the market. Current trends have focused on thinner displays, higher resolution, higher contrast, and increased display areas without making the device too large, etc. Most recently, there have been attempts to gain customer attention with curved displays or rounded display edges. With the adoption of organic light-emitting diodes (OLEDs), and in particular the emergence of flexible OLEDs, there is now a strong drive to produce devices that are foldable or rollable so that in addition to being compact, they can also be deployable to form a larger, continuous display.

One focus of current attempts to produce foldable or rollable devices is on making the devices less resistant to folding by segmenting or corrugating part of the structure in particular locations. Other attempts focus on ways to manage the position of the neutral plane(s) (i.e. the plane where tensile and compressive strain cancel each other, or in essence, where tensile and compressive strain is absent) as the multi-layer display is subjected to repeated folding and unfolding events. In these designs, the OLED layer is bonded to other layers of the device with significant efforts being made to position the OLED layer in the neutral plane and maintaining it in this plane during repeated flexing of the display. Due to the fragile nature of the OLED layer, significant effort is directed at designing the display stack so that the neutral plane is at, or at the very least, close to, the OLED layer. To help maintain the neutral plane in its required position, display stacks have been disclosed with so-called stress control members or elasticity adjusting layers (hereinafter "assembly layers"). In these cases, each of the individual layers of the display stack have been bonded together. As a result, individual film layers are now mechanically coupled and, for example, the bending stiffness of the composite structure (i.e., cover film/assembly layer/touch sensor layer/assembly layer/barrier layer/OLED layer/OLED substrate layer) is higher than if each layer were allowed to move independently from the others (as if there is no friction between them). As a result of being bonded, stresses and strains can also develop that may become increasingly significant as the modulus of the assembly layer increases.

FIG. 1 shows a typical cross-sectional view of a prior art flexible strain/stress-sensitive display 10. The prior art flexible strain/stress-sensitive 10 display generally includes a bottom layer or device housing 12 ("bottom housing 12"), a first assembly layer 14, an OLED module 16, a second assembly layer 18, a touch sensor 20, a third assembly layer 22, and a cover film 24. While not described here, other layers may be present in the display 10. For example, a circular polarizer or color filter may be positioned between the OLED layer or OLED module and the cover film. The OLED module 16 may generally include a flexible substrate 26, an OLED layer 28 and a flexible encapsulation layer 30. Although the OLED module is shown in FIG. 1 with only three layers, the OLED module 16 may include more layers. It has been demonstrated that these types of OLED modules (sometimes also called POLEDs for plastic OLEDs) are quite flexible and durable. However, to integrate this module into an actual device, it may have to be attached to a bottom layer 12 (for example an external driver circuit, a protective film, a flexible battery, etc.). The first assembly layer 14 can be optically clear, but it does not have to be as most POLEDs are top emitting. The top of the OLED module 16 may be attached to a flexible touch sensor 20, such as those based on polyester or cyclic olefin copolymer covered with an electro-conductive layer, such as a silver nanowire pattern. On top of the touch sensor 20 (or on top of the OLED module if the sensor is embedded or not used), a flexible cover film 24 is frequently applied. Between the OLED module 16 and the touch sensor 20, and between the touch sensor 20 and the cover film 24, are second and third assembly layers 18 and 22, respectively, applied to the whole surface of the display. The second and third assembly layers 18 and 22 are frequently optically clear adhesive layers. All of the assembly layers 14, 18 and 22 may also be an elasticity adjusting layer, a stress control member, or a stress redistribution layer. In addition to bonding the individual layers (bottom layer/OLED module/touch sensor/cover film) together, the assembly layers 14, 18 and 22 also need to fulfil the role of positioning the neutral plane in the stack in the right location (i.e. at or very close to the OLED layer 28, which may be damaged by even a slight amount of strain, compressive or tensile) and keeping it there during repeated bending of the display.

If any of the assembly layers 14, 18 and 22 deforms or creeps under the applied stress, there is a possibility that its thickness becomes non-uniform, resulting in optical distortions if the layer is in the path of the light emitted from the OLED module 16 or reflecting from it. Additionally, when a device including the OLED display 10 is turned off or closed for longer periods of time (i.e., overnight) or becomes hot (i.e., placed in a car exposed to sunlight in the summer time), the creep can become pronounced. Even if the assembly layer deformation is fully recoverable, excessively long relaxation times may make the image distortion too long-lasting. The assembly layers 14, 18 and 22 may also suffer from fatigue resulting from thousands of bending cycles occurring at different rates and different temperatures.

SUMMARY

In one embodiment, the present invention is a flexible display including a fluid cavity, fluid within the fluid cavity, and a strain/stress-sensitive module positioned within the fluid cavity. The strain/stress-sensitive module includes a flexible substrate, a flexible encapsulation layer, and an OLED layer positioned between the flexible substrate and the flexible encapsulation layer.

In another embodiment, the present invention is a display device including a bottom layer, a touch sensor, a fluid cavity positioned between the bottom layer and the touch sensor, fluid within the fluid cavity, a strain/stress-sensitive module positioned within the fluid cavity, an optically clear assembly layer positioned adjacent the touch sensor, and a cover film positioned adjacent the optically clear assembly layer.

DETAILED DESCRIPTION

The present invention is a design for display devices including a flexible strain/stress-sensitive display, such as an organic light-emitting diode (OLED) module, where the strain/stress-sensitive display is allowed to essentially float freely in a cavity filled with fluid or fluid-like material. While this specification refers specifically to OLEDs, the present invention can also apply to other strain/stress-sensitive flexible display modules, such as electro-wetting, electrophoretic, MEMS or flexible liquid crystal display modules without departing from the intended scope of the present invention. Other strain/stress-sensitive elements that may be present in a display device, such as a touch sensor or photovoltaic layer generating power for the device can also be protected using the fluid cavity design of the present invention. Unlike current designs, in the construction of the present invention, the OLED module is mechanically isolated from the rest of the display device and is positioned in its own cavity. To avoid the presence of air gaps, and the potential resulting deterioration of optical quality of the display, the cavity is filled with an optically clear fluid or fluid-like material and sealed to avoid air ingress during use of the display device.

Figure 1:
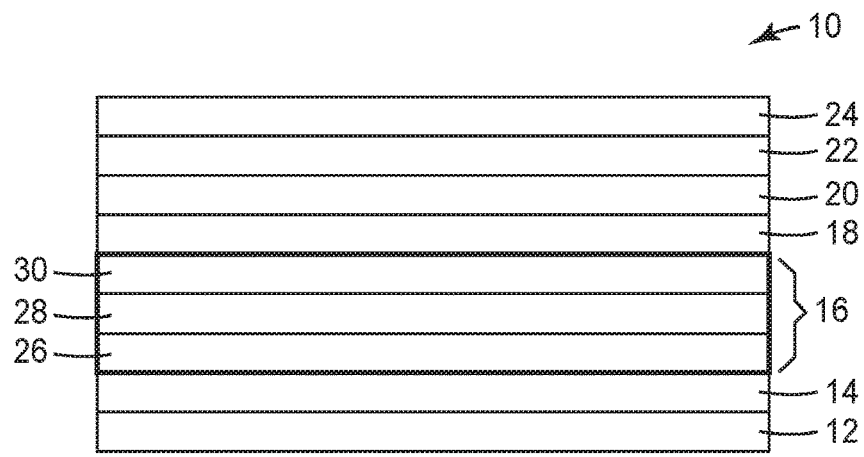
FIG. 1 is a cross-sectional view of a prior art flexible display.
Figure 2:
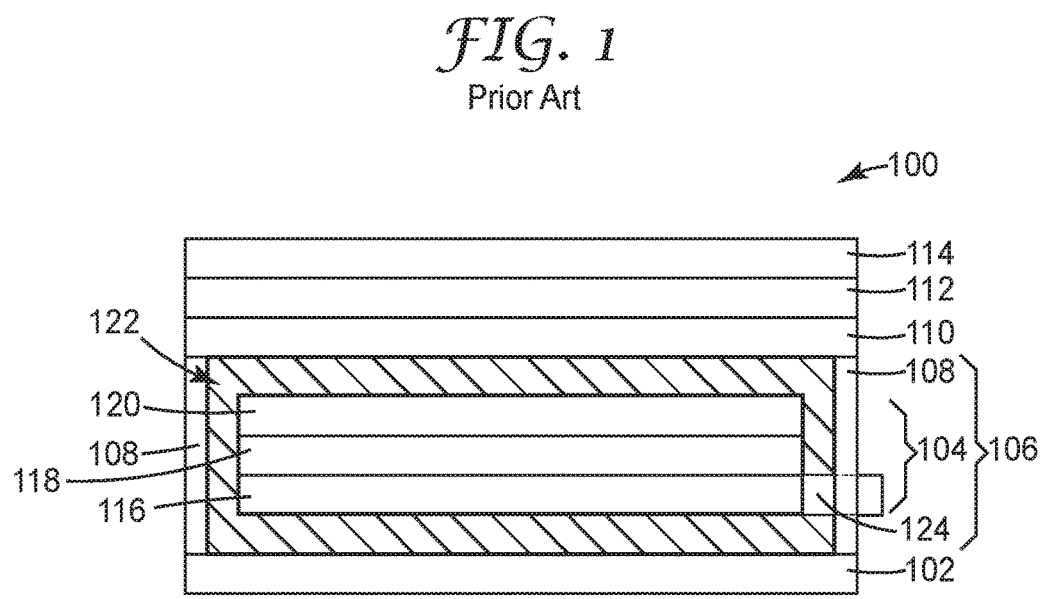
FIG. 2 is a cross-sectional view of a first embodiment of a flexible display of the present invention.

FIG. 2 shows a cross-sectional view of a first embodiment of a flexible display 100 of the present invention. The first embodiment of the flexible display 100 includes a bottom layer or device housing 102 ("bottom layer 102"), an OLED module 104, a fluid cavity 106, seals 108, a touch sensor 110, an optically clear assembly layer 112, and a cover film 114. The bottom layer 102 and cover film 114 may be flexible or rigid substrates. For example, the cover film 114 may be a curved polycarbonate film or lens against which the flexible OLED module 104 is positioned during assembly of the flexible display 100 or a device including the flexible display 100. In such an assembly, the OLED module 104 must be flexed at least once but may not be subjected to repeated folding and unfolding. The cover film 114 may be any substrate as long as it is optically clear. As used herein, the term "optically clear" refers to a material that has a luminous transmission of greater than about 90 percent, a haze of less than about 2 percent, and opacity of less than about 1 percent in the 400 to 700 nm wavelength range. Both the luminous transmission and the haze can be determined using, for example, ASTM-D 1003-95. The fluid cavity 106 is positioned between the bottom layer 102 and the touch sensor 110. The OLED module 104 is positioned within the fluid cavity 106 and includes a flexible substrate 116, an OLED layer 118 and a flexible encapsulation layer 120. The cover film 114 is then attached to the touch sensor 110 by the optically clear assembly layer 112. While the touch sensor 110 is described and shown as being adjacent to, and forming a wall of the fluid cavity 106, any other layer may be positioned adjacent to the OLED module 104 or fluid cavity 106 to create the fluid cavity 106. For example, a circular polarizer may be used if it is positioned closer to the OLED module 104 than the touch sensor 110.

The OLED module 104 is built on the flexible substrate 116 with the OLED layer 118 positioned between the flexible substrate 116 and the flexible encapsulation layer 120. Although FIG. 2 depicts the OLED module 104 as including three layers, the OLED module 104 may include additional layers without departing from the intended scope of the present invention. The flexible substrate 116 may be formed of a plastic material having heat resistance, dimensional stability under heat exposure, and durability. Examples of suitable plastic substrates include, but are not limited to: polyethylene terephthalate, polyethylene naphthalate, cyclic olefin copolymer, polyimide, polyethersulfone, polyetherimide, and the like. In one embodiment, the OLED layer 118 may be formed by depositing a buffer layer on the flexible substrate 116 to planarize it. A thin film transistor (TFT), a capacitor, and the actual OLED is then deposited on the buffer layer to form the OLED layer 118. The TFT may include an active layer, a gate electrode, and source and drain electrodes. The actual OLED may include a first electrode, a second electrode, and an intermediate layer. To seal the OLED layer 118 from the environment, the flexible encapsulation layer 120 is applied. The flexible encapsulation layer 120 may include, for example, an organic film and an inorganic film, wherein each of the organic and inorganic films may have a plurality of layers. The flexible encapsulation layer 120 may also be formed by layering multiple layers of organic film and inorganic film on top of each other.

The sides of the fluid cavity 106 are surrounded by seals 108. The seals 108 provide bonding to the other layers, such as the touch sensor 110 and the bottom layer 102, and thus provide a sealed cavity which is to be filled with a fluid 122 or a fluid-like (i.e. Newtonian fluid or non-Newtonian fluid), or even a soft gel type material. In this configuration, the OLED module 104 is surrounded by the fluid 122 and in essence suspended in the fluid cavity 106. The OLED module 104 thus experiences minimal to no bending stresses or friction with the other layers of the OLED display 100 during bending or folding. The seals 108 also function to prevent fluid leakage so that no air can be entrained in the fluid cavity 106 that would show as bubbles in the viewing area of the flexible display 100. In one embodiment, the seals 108 are also rigid enough so that they do not bulge or compress too much, which would result in severe deformation of the fluid cavity 106. In one embodiment, if the other layers, such as the touch sensor 110 and the bottom layer 102, can be sealed together to form the fluid cavity 106, the seals 108 may not be needed. For example, if the bottom layer 102 is ultra-sonically welded to the touch sensor 110, a fluid cavity can be formed without the use of seals.

Depending on their location around the fluid cavity 106, the seals 108 can either be designed differently or may be substantially the same. For example, the seals 108 could be made from the same material with the same mechanical properties or they could be made from dissimilar materials with different mechanical properties, or the same materials with different mechanical properties, etc. The seal materials need to have sufficient mechanical strength to maintain the structural integrity of the seal and the fluid cavity 106 upon folding and unfolding of the flexible display. The shape (i.e., the thickness and width) of the seals 108 can also be different based on their position around the fluid cavity 106 and the flexibility/bond strength required. For example, if the fluid cavity 106 is thicker, the seals 108 may experience a fairly significant amount of shear stress and the shape could be optimized to prevent debonding from an adjacent substrate. The sealing materials do not have to be optically clear because they are typically positioned outside of the viewing area of the display. In one embodiment, the materials can be opaque, colored or filled. Suitable materials that may serve as sealants may include, but are not limited to, compositions wherein within a temperature range of between about −30° C. to about 90° C., the sealant has a shear storage modulus at a frequency of 1 Hz that does not exceed about 2 MPa, shows a shear creep compliance (J) of at least about $6 \times 10^{-6}$ 1/Pa measured at 5 seconds with an applied shear stress between about 50 kPa and about 500 kPa, and shows a strain recovery of at least about 50% within about 1 minute after removing the applied stress. Examples include, but are not limited to: an acrylic homopolymer or random co-polymer, an acrylic block copolymer, a physically cross-linked silicone elastomer, a covalently cross-linked silicone elastomer, a polyurethane, a polyisoprene, a polybutadiene, an olefin block copolymer, a polyisobutylene, and a high alkyl polyolefin. The sealant material must be resistant to the fluid 122 filling the fluid cavity 106 (i.e. the seal cannot swell, leak, degrade, when in contact with the "fluid"). Fluid resistant sealants that can handle significant amounts of shear deformation and provide good adhesion to the substrates of the cavity can also be used. Examples may include, but are not limited to: window sealants (i.e., butyl rubbers or silicones) and sealants used in the aerospace (i.e., polysulfides) and automotive industries. If any of the sides are mechanically clamped, it may even be possible to use gasketing materials in that location, such as those derived from fluoroelastomers, available for example, from 3M Company located in St. Paul, Minn. An effective mechanical seal may also be used provided it does not interfere with the free movement of the layers making up the fluid cavity 106.

In one embodiment, the flexible substrate 116 of the OLED module 104 may be extended to serve as a tail 124 to anchor the OLED module 104 to a seal 108. The seal 108 could be along the long edge BB (shown in FIG. 4B), defined as the edge perpendicular to the bending axis 350 (shown in FIG. 4B) of the display stack, along the short edge AA (shown in FIG. 4B), defined as the edge parallel to the bending axis, or both. Note that depending on the folding axis of the device, the long and short edges may be reversed in terms of their relative orientation to the bending axis 350. In one embodiment, the seal 108 along the long edge BB may be more rigid than the seal 108 along the short edge AA, which may see higher shear induced strain during bending or folding. The short edge AA may also provide a more secure anchoring point for the OLED module 104 and may also provide a natural pathway for the OLED module 104 to be connected to some peripheral driver, power source, etc., for example, by extending the tail 124 covered with electro-conductive traces through the seal 108.

Because the OLED layer 118 or OLED module 104 is not bonded to any adjacent display stack layers, it is in a neutral plane even under repeated bending. The thickness of the fluid cavity 106 does not have to be very high. While technically and performance-wise there is no real upper limit, in practice the thickness and weight of the flexible display will dictate the maximum thickness of the cavity. In one embodiment, only a few microns beyond the thickness of the OLED module 104 is sufficient to prevent strain generation in the OLED layer 118 from the bending of surrounding, stiffer layers (normally bonded to the OLED module). In another embodiment, the fluid cavity 106 is about 1 micron or less, as long as there is enough fluid 122 to lubricate between the OLED module 104 and adjacent display stack layers. In addition, because the walls of the fluid cavity 106 are so thin, the fluid cavity 106 could be constructed from a stiffer material. For example, the fluid cavity 106 may be constructed of glass or rigid plastic as long as the stiffer material can handle repeated bending and has at least one side that is transparent to the emission of the flexible display 100. When the surrounding fluid cavity 106 is constructed of a stiffer material, the seals 108, the touch sensor 110 and the bottom layer 102 may not need to be relied upon to provide enclosure of the fluid cavity 106 and its mechanical integrity. The fluid cavity 106 may also be surrounded by soft materials, such as thin films and elastomeric substrates, to form a pouch. When properly sealed, the pouch will not collapse because of the fluid contained inside, and thus can also securely hold a fragile component, like an OLED module 104.

The OLED module 104 can be, but does not have to be, centered in the fluid cavity 106. For example, the OLED module 104 may be positioned towards the bottom of the fluid cavity 106 to provide better protection from impact on the top of the OLED module 104 by placing more fluid 122 between the OLED module 104 and the outer layer of the fluid cavity 106.

The fluid 122 within the fluid cavity 106 can be any fluid known in the art that is optically clear and durable for the life of the device (i.e. cannot discolor or become hazy). The fluid 122 can be a Newtonian fluid or non-Newtonian fluid, a fluid-like material (for example, a thixotropic material), or even a soft gel. The fluid 122 also serves as a lubricant and helps to more closely match the refractive index between the OLED module 104 and the upper layer of the fluid cavity 106 (versus an air gap), so contrast and brightness of the display output can be maintained. In another embodiment, the fluid 122 can also be a material as simple as mineral oil or a more specialized fluid, such as those available under the NOVEC brand, available from 3M Company located in St. Paul, Minn. Any fluid can be used as long as the fluid is, and remains during use, optically clear and does not degrade the materials of the walls making up the fluid cavity 106 or the OLED module 104 itself. For fluid-like materials, their viscosities may be modified with thixotropic agents, such as, for example, silica, associative thickeners or nanoparticles, to make them highly viscous in the absence of shear, but thinning to lower viscosity when exposed to shear forces. In the extreme, soft gel material may be useful. Suitable materials that may serve as soft gels may include, but are not limited to, compositions wherein within a temperature range of between about −30° C. to about 90° C., the soft gel layer has a shear modulus that does not exceed about 10 kPa and a viscosity that does not exceed about 150,000 cP. For example, mineral oil extended polystyrene/polyisoprene/polystyrene block copolymers may be used as soft gel materials. Generally, any "fluid" can be used as long as it does not freeze, decompose, lose optical quality, or boil within the use temperature range of the device.

Figure 3:
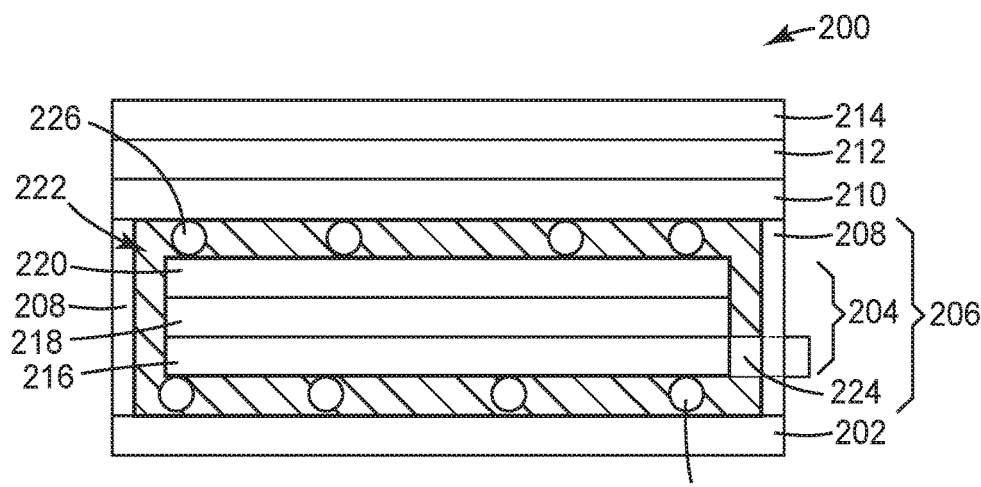
FIG. 3 is a cross-sectional view of a second embodiment of a flexible display of the present invention.

FIG. 3 is a cross-sectional view of a second embodiment of a flexible display 200 of the present invention. The second embodiment of the flexible display 200 is similar to the first embodiment of the flexible display 100 and includes a bottom layer or device housing 202, an OLED module 204, a fluid cavity 206, seals 208, a touch sensor 210, an optically clear assembly layer 212, and a cover film 214. The OLED module 204 is positioned within the fluid cavity 206 and includes a flexible substrate 216, an OLED layer 218 and a flexible encapsulation layer 220. Similar components and layers are situated and function similarly to respective components of the first embodiment of the flexible display 100. The second embodiment differs from the first embodiment in that the second embodiment includes a means to support the OLED module 204 in the fluid cavity 206 to minimize the risk of the OLED module 204 from floating or sinking and touching the walls of the fluid cavity 206. In one embodiment, the flexible display 200 includes spacers 226 around the OLED module 204 to maintain a gap between the walls of the fluid cavity 206 and the OLED module 204. In one embodiment, the spacers 226 are beads. The spacers closely match the refractive index of the fluid 222 in the fluid cavity 206 so that they are not visible. These types of spacers are well-known in the art of the display industry, for example, spacer beads that set the cell-gap of a liquid crystal display module. In addition, although FIG. 3 depicts the spacers as beads, the spacers may include other shapes or structures, such as small posts or ridges, without departing from the intended scope of the present invention. In one embodiment, the spacers in the form of posts or ridges have a width ranging from about 0.002 mm to about 5 mm and a height ranging from about 0.001 mm to about 3 mm. In one embodiment, the space between the posts or ridges range from about 0.003 mm to about 5 mm.

Figure 4A:
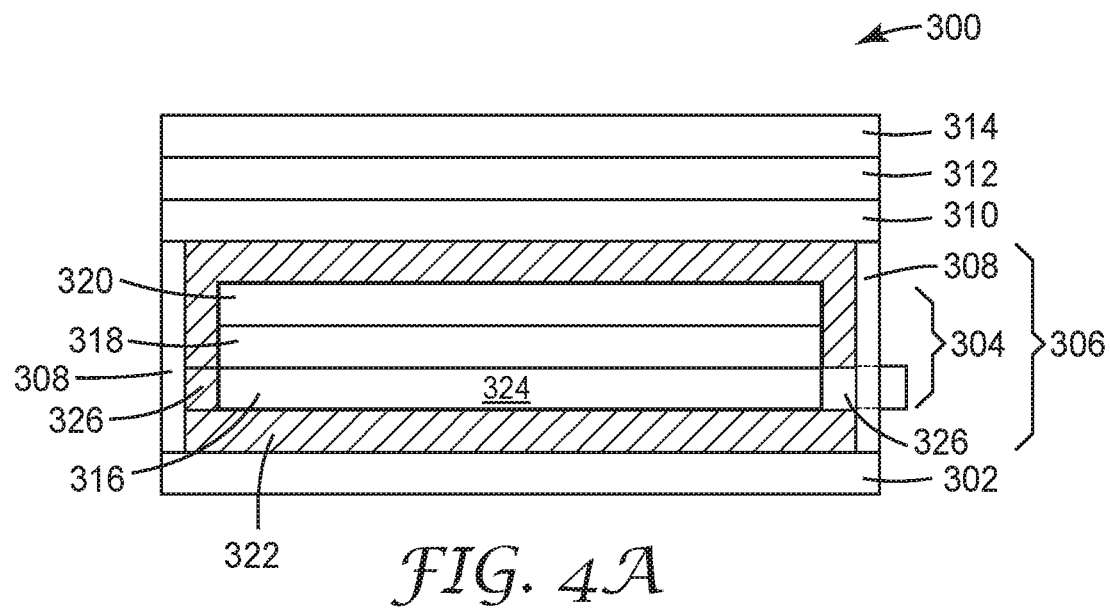
FIG. 4A is a cross-sectional view of a third embodiment of a flexible display of the present invention.
Figure 4B:
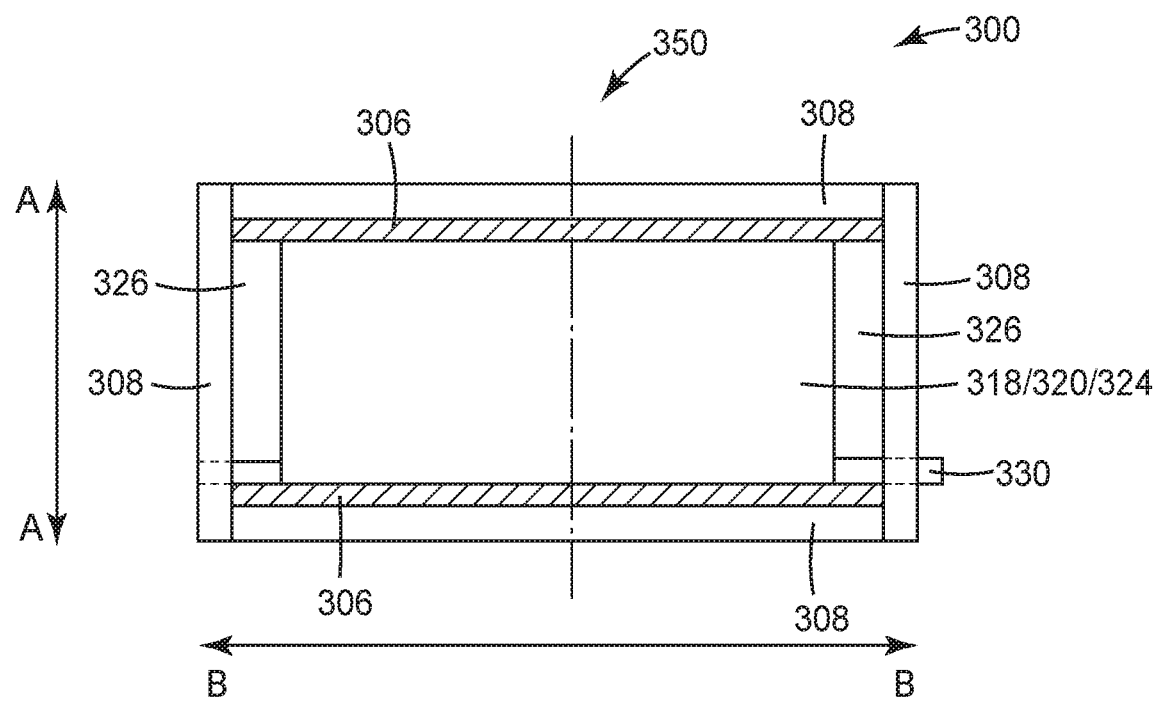
FIG. 4B is a top view of the third embodiment shown in FIG. 4 of the flexible display of the present invention.

FIGS. 4A and 4B show a cross-sectional view and a top view, respectively, of a third embodiment of a flexible display 300 of the present invention. The third embodiment of the flexible display 300 is similar to the second embodiment of the flexible display 200 and includes a bottom layer or device housing 302, an OLED module 304, a fluid cavity 306, seals 308, a touch sensor 310, an optically clear assembly layer 312, a cover film 314, and means for supporting the OLED module within the fluid cavity. The OLED module 304 is positioned within the fluid cavity 306 and includes a flexible substrate 316, an OLED layer 318 and a flexible encapsulation layer 320. Similar components and layers are situated and function similarly to respective components of the second embodiment of the flexible display 200. In the third embodiment of the flexible display 300, the substrate is an extended flexible substrate 324, which is a means for supporting the OLED module. In this embodiment, the OLED layer 318 and flexible encapsulation layer 320 are built on the extended flexible substrate 324, which includes the flexible substrate 116 and the extended tails 326. The tails 326 are embedded in the seals 308 and provide anchorage points on opposed sides of the fluid cavity 306. The OLED module 304 thus basically hangs in the fluid 322, suspended from the tails 326. As can be seen in the embodiment shown in FIG. 4b, the OLED module 304 hangs from the tails 326 on both sides of the fluid cavity 306.

Figure 5:
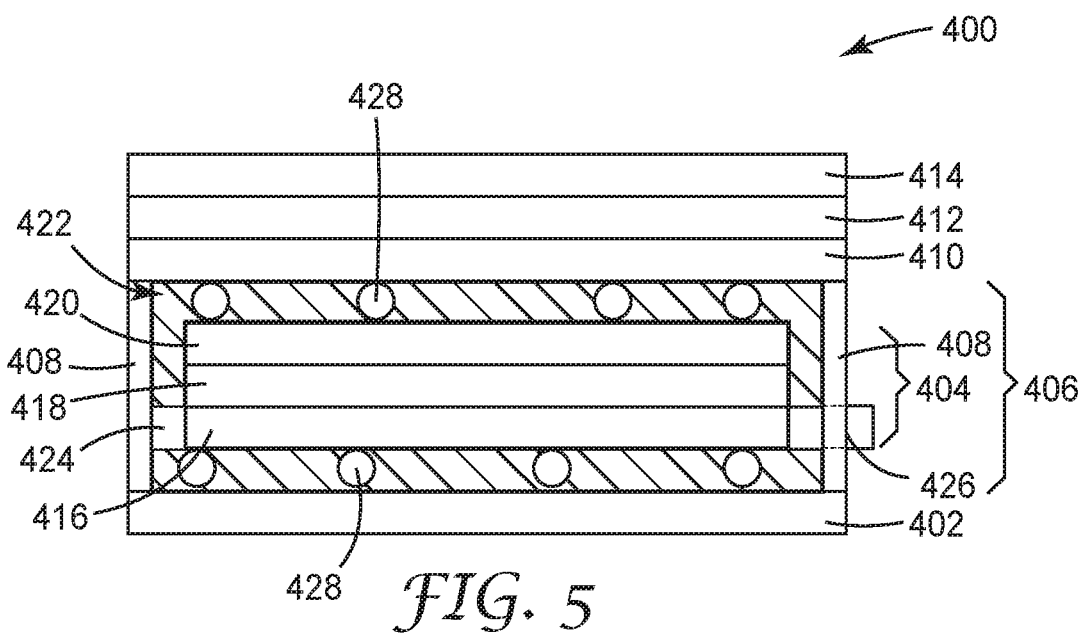
FIG. 5 is a cross-sectional view of a fourth embodiment of a flexible display of the present invention.

FIG. 5 depicts a cross-sectional view of a fourth embodiment of a flexible display 400 of the present invention. The fourth embodiment of the flexible display 400 is similar to the second and third embodiments of the flexible display 200 and 300 and includes a bottom layer or device housing 402, an OLED module 404, a fluid cavity 406, seals 408, a touch sensor 410, an optically clear assembly layer 412, a cover film 414, and means for supporting the OLED module 404 within the fluid cavity 406. The OLED module 404 is positioned within the fluid cavity 406 and includes a flexible substrate 416, an OLED layer 418 and a flexible encapsulation layer 420. Similar components and layers are situated and function similarly to respective components of the second and third embodiments of the flexible display 200 and 300. The fourth embodiment of the flexible display 400 includes a soft spring 424 to support the OLED module 404 in the fluid cavity 406. The OLED module 404 is connected on one side with an extended tail 426 made from the flexible substrate 416, while the other side is made from a soft spring 424. The "soft spring" is defined as a material that keeps the OLED module 404 in position without potentially causing significant strain or stress in the OLED flexible substrate 416 that could damage the layers deposited on top of it.

In another embodiment, soft springs 424 extend on all four sides and are attached to the seals 408. In this embodiment, the soft springs 424 keep the flexible display 400 taut when opened and flat but can also stretch without causing strain/stress that would damage the OLED module 404 during folding.

In one embodiment, the soft spring 424 can be, for example: a film, a mesh type structure or a perforated film. Structures such as a mesh or a perforated film allows the fluid 422 to pass through the soft spring with only limited restriction, yet still prevent spacer beads (if used) from settling on the bottom. In another embodiment, the spring may be a true spring or set of springs located outside of the viewing area of the display. For example, the spring may be a metallic coil spring.

While FIG. 5 depicts the flexible display 400 as including spacer beads 428, the spacer beads are optional.

Figure 6:
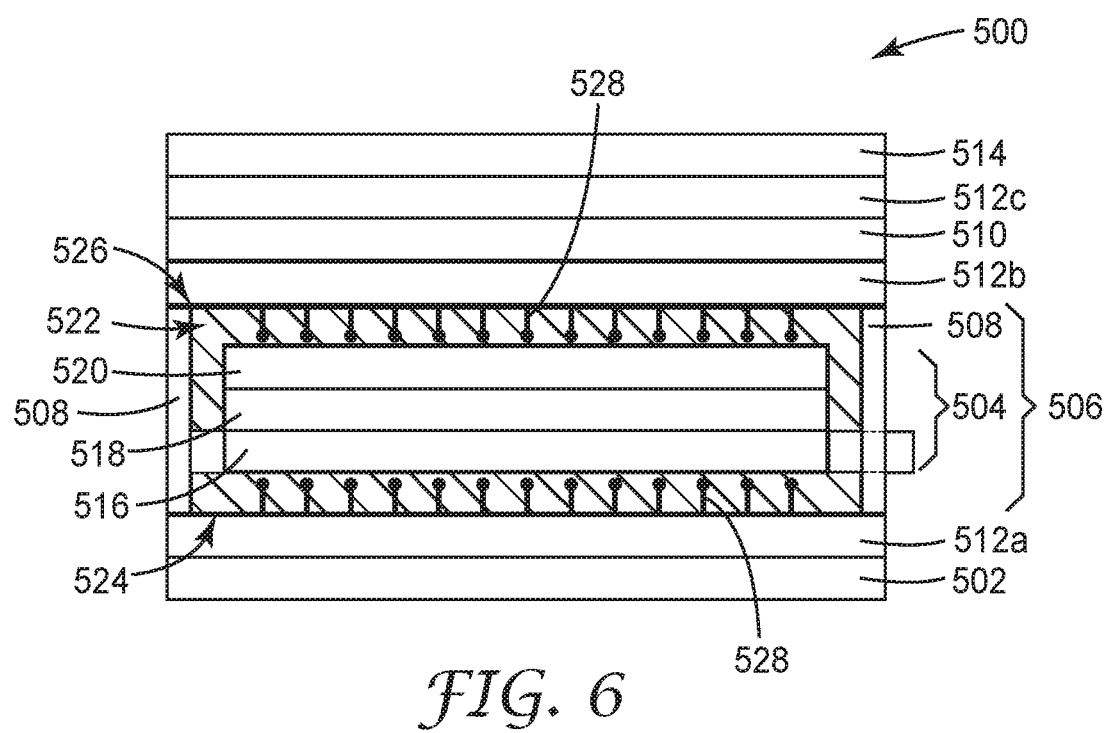
FIG. 6 is a cross-sectional view of a fifth embodiment of a flexible display of the present invention.

FIG. 6 is a cross-sectional view of a fifth embodiment of a flexible display 500 of the present invention. The fifth embodiment of the flexible display 500 is similar to the fourth embodiment of the flexible display 400 and includes a bottom layer or device housing 502, an OLED module 504, a fluid cavity 506, seals 508, a touch sensor 510, first assembly layer 512a, second assembly layer 512b, third assembly layer 512c, a cover film 514, and means for supporting the OLED module 504 within the fluid cavity 506. The OLED module 504 is positioned within the fluid cavity 506 and includes a flexible substrate 516, an OLED layer 518 and a flexible encapsulation layer 520. Similar components and layers are situated and function similarly to respective components of the fourth embodiment of the flexible display 400. In the fifth embodiment of the flexible display 500, the fluid cavity 506 is created between a bottom film 524 and a top film 526 fused at the edges to the seals 508. In another embodiment, the bottom film 524 and top film 526 may be fused to each other, so that seals are not needed. The bottom and top films 524 and 526 completely surround the fluid cavity 506 containing the OLED module 504 and the fluid 522. The bottom and top films 524 and 526 may be fused to the seals 508 by any means known in the art, for example by ultra-sonic welding; and may include techniques to promote adhesion such as with the aid of a chemical primer or a physical treatment of the adhering surfaces, such as corona or flame treatment. The bottom and top films 524 and 526 and the fluid 522 are selected so that the bottom and top films 524 and 526 forming the fluid cavity 506 and its contents remain durable and optically clear (at least on the emissive side of the OLED module) for the life of the device using the flexible display 500. In one embodiment, the materials of the bottom and top films 524 and 526 could be selected from completely different material sets than, for example, those suitable for a flexible touch sensor. Suitable examples of materials for the bottom and top films 524 and 526 include, but are not limited to: amorphous polyolefins, polyurethanes, acrylics, polyimides, polysulfones, polyesters, etc. In some instances, the flexible films may also be substituted with flexible glass or clear, flexible ceramic like Spinel.

The fluid cavity 506 containing the OLED module 504 of the fifth embodiment of the flexible display 500 can be manufactured independently from the rest of the display stack and then eventually bonded to the rest of the layers in the display stack. This would allow the OLED module 504 to be better protected during shipment and handling.

Similar to other embodiments, means for supporting the OLED module 504 can also be used to stop the OLED module 504 from accidentally touching the walls of the fluid cavity 506 or from bunching up after repeated bending cycles.

In one embodiment, at least second and third assembly layers 512b and 512c are optically clear.

While FIG. 6 depicts small posts 528 being used as spacers, any structure may be used as long as they have a refractive index that closely matches the refractive index of the fluid and/or are small enough that they are not visible in the final display.

Although the present invention has been described with reference to preferred embodiments, workers skilled in the art will recognize that changes may be made in form and detail without departing from the spirit and scope of the invention.

What is claimed is:

1. A flexible display comprising:
   a fluid cavity;
   fluid within the fluid cavity; and
   a strain/stress-sensitive module positioned within the fluid cavity, wherein the strain/stress-sensitive module comprises:
      a flexible substrate;
      a flexible encapsulation layer; and
      an OLED layer positioned between the flexible substrate and the flexible encapsulation layer.

2. The flexible display of claim 1, wherein the strain/stress-sensitive module comprises one of an organic light emitting diode (OLED) module, an electrophoretic module, an electro-wetting module, a MEMS display, a photo voltaic layer, a touch sensor layer, or a flexible liquid crystal module (LCD).

3. The flexible display of claim 1, further comprising means for supporting the strain/stress-sensitive module within the fluid cavity.

4. The flexible display of claim 3, wherein the means for supporting the strain/stress-sensitive module comprises spacers.

5. The flexible display of claim 1, further comprising a soft spring for supporting the strain/stress-sensitive module.

6. The flexible display of claim 1, further comprising a seal at least partially surrounding the fluid cavity.

7. The flexible display of claim 1, wherein the flexible substrate includes extended tails.

8. The flexible display of claim 1, wherein the fluid comprises one of a Newtonian fluid, a non-Newtonian fluid, a fluid-like material and a soft gel.

9. The flexible display of claim 1, wherein the strain/stress-sensitive module is not bonded to any adjacent display stack layers.

10. The flexible display of claim 1, wherein the strain/stress-sensitive module is in or near a neutral plane even when subjected to bending.

11. A display device comprising:
    a bottom layer;
    a cover film;
    a fluid cavity positioned between the bottom layer and the cover film;
    fluid within the fluid cavity;
    a strain/stress-sensitive module positioned within the fluid cavity; and
    an optically clear assembly layer positioned between the fluid cavity and the cover film.

12. The display device of claim 11, further comprising means for supporting the strain/stress-sensitive module.

13. The display device of claim 11, further comprising a soft spring for supporting the strain/stress-sensitive module.

14. The display device of claim 11, further comprising a seal at least partially surrounding the fluid cavity.

15. The display device of claim 11, wherein the strain/stress-sensitive module comprises:
    a flexible substrate;
    a flexible encapsulation layer; and
    an OLED layer positioned between the flexible substrate and the flexible encapsulation layer.

16. The display device of claim 15, wherein the flexible substrate includes extended tails.

17. The display device of claim of claim 11, further comprising an assembly layer positioned between the bottom layer and the fluid cavity.

18. The display device of claim 11, wherein the strain/stress-sensitive module is not bonded to any adjacent display stack layers.

19. The display device of claim 11, further comprising a touch sensor positioned between the fluid cavity and the optically clear assembly layer.

* * * * *